(12) United States Patent
Sano et al.

(10) Patent No.: US 8,436,633 B2
(45) Date of Patent: May 7, 2013

(54) METHOD TO DETERMINE NEEDLE MARK AND PROGRAM THEREFOR

(75) Inventors: Satoshi Sano, Nirasaki (JP); Yuji Akasaki, Tokyo (JP)

(73) Assignee: Tokyo Electron Limited, Tokyo (JP)

( * ) Notice: Subject to any disclaimer, the term of this patent is extended or adjusted under 35 U.S.C. 154(b) by 450 days.

(21) Appl. No.: 12/726,426

(22) Filed: Mar. 18, 2010

(65) Prior Publication Data
US 2010/0237894 A1    Sep. 23, 2010

(30) Foreign Application Priority Data
Mar. 19, 2009    (JP) .................................. 2009-068552

(51) Int. Cl.
*G01R 31/26*    (2006.01)
(52) U.S. Cl.
USPC .................................................... 324/762.01
(58) Field of Classification Search .. 324/754.01–754.3, 324/762.01–762.1, 755.01–755.11; 257/48; 438/14–18
See application file for complete search history.

(56) References Cited

U.S. PATENT DOCUMENTS 5,644,245 A * 7/1997 Saitoh et al. ............. 324/750.18
6,414,477 B1 * 7/2002 Strom ........................... 702/104

* cited by examiner

*Primary Examiner* — Tung X Nguyen
(74) *Attorney, Agent, or Firm* — Abelman, Frayne & Schwab

(57) ABSTRACT

Disclosed is a method to determine a needle mark, which can more accurately determine whether marks formed on electrode pads of devices are probe needle marks, thereby significantly reducing misdetermination of the marks as the probe needle marks. The method includes giving scores, which are used to determine the quality of marks as probe needle marks, to marks formed on a plurality of electrode pads of a plurality of devices, and selecting, based on the scores, an object device including an object electrode pad with an indefinite mark formed thereon, and selecting four comparison devices preceding the object device and nine time-successive comparison devices following the object device at successive times along the test direction, and determining if the indefinite mark of the object device is good or bad as a probe needle mark, by comparing a value of the score given to the indefinite mark of the object device plus scores given to marks formed on the comparison devices' comparison electrode pads corresponding to the object electrode pad, with a reference value.

8 Claims, 8 Drawing Sheets left edges + right edges left edges right edges

METHOD TO DETERMINE NEEDLE MARK AND PROGRAM THEREFOR

This application is based on and claims priority from Japanese Patent Application No. 2009-068552, filed on Mar. 19, 2009, with the Japanese Patent Office, the disclosure of which is incorporated herein in its entirety by reference.

TECHNICAL FIELD

The present disclosure relates to a method and a program to determine a needle mark, more particularly, to a method and a program to determine a quality of the needle mark formed on a plurality of electrode pads of devices when an electrical property test of the devices formed on a semiconductor wafer is performed.

BACKGROUND

As a device test method, there is a method to provide a semiconductor wafer with a plurality of devices formed thereon to a testing apparatus including a probe card, and test electrical properties of each device in a state where the devices are formed on the wafer. In this method, the test on the electrical properties of each device is carried out by electrically contacting each of a plurality of electrode pads of each device formed on the semiconductor wafer with a plurality of probes installed in the probe card. Through this test, one probe needle mark is formed on each of the plurality of electrode pads of the devices. When all of the probes appropriately electrically contact with their corresponding electrode pads, the test on the electrical properties of the devices can be certainly performed.

However, some of the plurality of probes sometimes cannot accurately contact with the electrode pads, because there is a problem in their installation, or they are deformed with the lapse of time due to the repetitive uses of the probe card. This contact failure causes test failure.

Therefore, in the conventional art, a semiconductor wafer is observed with the naked eye or an image of the semiconductor wafer is obtained by using an image capturing means, such as a CCD camera, and the quality of the probe needle mark formed on a plurality of electrode pads of each device is automatically determined based on the captured image.

However, in the case where an image capturing means, such as a CCD camera is used, as in the conventional art, when the quality of each of marks formed on a plurality of electrode pads is individually determined as a probe needle mark, the determination may be wrong due to the following reasons. For example, when the image capturing means captures an image of a semiconductor wafer, it cannot be accurately recognized as a probe needle mark due to a change in luminance between an electrode pad and a needle mark of a probe. Also, a probe needle mark may be inaccurately determined due to the position of the probe needle mark formed across the edge of an electrode pad. Or, when a cut-off scrap caused by a probe remains in the electrode pad, the cut-off scrap may be misrecognized as a probe needle mark of the probe. As described above, the image of the electrode pad may include various shapes of marks. Thus, it is difficult to accurately determine if these marks are actually probe needle marks. Further, even though these marks are actually probe needle marks, it is difficult to accurately determine if they are appropriate as needle marks.

SUMMARY

According to one embodiment, there is provided a method to determine a quality of a needle mark including, when an electrical property test is performed on a plurality of devices formed on a semiconductor wafer by electrically contacting a plurality of electrode pads of each of the plurality of devices with a plurality of probes, obtaining a captured image of the semiconductor wafer by an image capturing means, and determining if respective marks formed on the plurality of electrode pads of the devices are good or bad as probe needle marks based on the captured image. The method includes selecting an object device including an object electrode pad with an indefinite mark as a probe needle mark formed thereon, and thereby selecting a certain number of comparison devices preceding the object device at successive times and another certain number of comparison devices following the object device at successive times along a test direction, and determining if the indefinite mark of the object electrode pad is good or bad as the needle mark as the probes based on a change in mark over time among the indefinite mark of the object electrode pad and marks formed on respective comparison electrode pads of the plurality of comparison devices preceding and following the object device, the respective comparison electrode pads corresponding to the object electrode pad.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIGS. 4A to 4C are schematic plan views illustrating device's images captured by a CCD camera of the testing apparatus shown in FIG. 1, in which FIG. 4A is a view showing marks at both left and right edges of electrode pads, FIG. 4B is a view showing marks at left edges of electrode pads, and FIG. 4C is a view showing marks at right edges of electrode pads.

DETAILED DESCRIPTION

Figure 1:
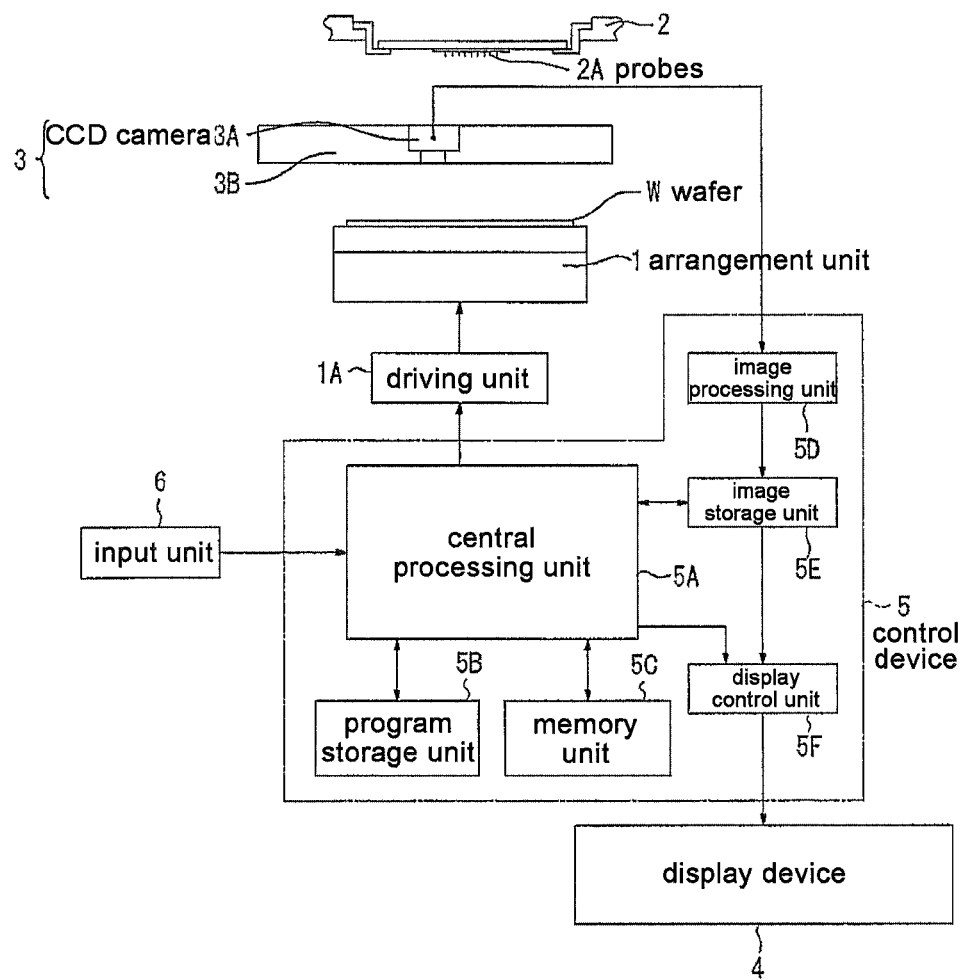
FIG. 1 is a configuration view illustrating one example of a testing apparatus, in which a needle mark determining method of the present disclosure is applied.

In the following detailed description, reference is made to the accompanying drawings, which form a part hereof. The illustrative embodiments described in the detailed description, drawings, and claims are not meant to be limiting. Other embodiments may be utilized, and other changes may be made, without departing from the spirit or scope of the subject matter presented here.

The present disclosure provides a method and a program to determine a needle mark, which can more accurately determine whether or not marks formed on electrode pads of devices are probe needle marks, thereby significantly reducing misdetermination regarding the probe needle marks.

According to one embodiment, there is provided a method to determine a quality of a needle mark including, when an electrical property test is performed on a plurality of devices formed on a semiconductor wafer by electrically contacting a plurality of electrode pads of each of the plurality of devices with a plurality of probes, obtaining a captured image of the semiconductor wafer by an image capturing means, and determining if respective marks formed on the plurality of electrode pads of the devices are good or bad as probe needle marks based on the captured image. The method includes giving scores, which are used to determine the quality of the marks as the probe needle marks, to the respective marks formed on the plurality of electrode pads of each of the plurality of devices, and selecting, based on the scores, an object device including an object electrode pad with an indefinite mark as a probe needle mark formed thereon; and selecting a certain number of successive comparison devices preceding the object device and another certain number of successive comparison devices following the object device along a test direction, adding scores given to marks formed on the comparison electrode pads of each of the plurality of comparison devices to a score given to the indefinite mark of the object device, and determining if the indefinite mark of the object device is good or bad as the probe needle mark by comparing an added value with a reference value. The respective comparison electrode pads correspond to the object electrode pad.

Also, when the number of the successive comparison devices preceding the object device does not satisfy said certain number, the number of the object device plus a plurality of successive comparison devices following the object device may be added to said number of the successive comparison devices preceding the object device to satisfy said certain number.

Also, when the number of the successive comparison devices following the object device does not satisfy said another certain number, the number of the object device plus a plurality of successive comparison devices preceding the object device may be added to said number of the successive comparison devices following the object device to satisfy said another certain number.

Also, when all of the marks formed on the respective comparison electrode pads of said plurality of successive comparison devices preceding the object device are determined to be bad or good, the indefinite mark of the object device may be determined to be good or bad as the probe needle mark without determining quality of the marks formed on the comparison electrode pads of the plurality of successive comparison devices following the object device.

Also, the scores may be given based on positions or areas of the marks on the electrode pads.

Also, when the scores are given based on the positions of the marks, the positions of the marks may be determined based on distances from edges of the marks to edges of the electrode pads.

Also, when the scores are given based on the positions of the marks on the electrode pads, the indefinite mark may indicate a mark formed in the neighborhood of edges of the object electrode pad.

According to another embodiment, there is provided a program to determine a needle mark formed in each of a plurality of electrode pads of a plurality of devices formed in a semiconductor wafer. The program may be stored in a computer readable media. The program is executed on a computer when an electrical property test is performed on the plurality of devices by electrically contacting the plurality of electrode pads with a plurality of probes. The program, when executed on the computer, performs the method described above.

Through the needle mark determining method and a needle mark determining program according to the present disclosure, marks formed on electrode pads of devices can be more accurately judged as probe needle marks, thereby significantly reducing misjudgment of the marks as the probe needle marks.

Hereinafter, exemplary embodiments will be described in detail with reference to FIGS. 1 to 8.

First, a testing apparatus used to perform a needle mark determining method of the present disclosure will be described. This testing apparatus, as shown in FIG. 1, includes a movable arrangement unit 1 to dispose a to-be-tested object, that is, a semiconductor wafer W thereon, a probe card 2 positioned above arrangement unit 1, an alignment mechanism 3 to align a plurality of probes 2A of probe card 2 with semiconductor wafer W on arrangement unit 1, an image capturing means (e.g., a CCD camera) 3A included in alignment mechanism 3, a display device 4 to display an image captured by CCD camera 3A, and a control device 5 including, as a main body, a computer to control the aforementioned components. Herein, under the control of control device 5, alignment mechanism 3 aligns a plurality of electrode pads of each device formed on semiconductor wafer W on arrangement unit 1, with the plurality of probes 2A of probe card 2, and then the electrical properties of semiconductor wafer W are tested by electrically contacting the plurality of probes 2A with the plurality of to electrode pads.

A driving unit 1A of arrangement unit 1 drives an XY table on which arrangement unit 1 is arranged. For example, driving unit 1A includes a horizontal driving part (not shown) mainly including a motor and a ball screw, a lift driving part embedded in arrangement unit 1, and a θ driving part to rotate arrangement unit 1 in the θ direction, and is configured to move arrangement unit 1 in X, Y, Z, and θ directions under the control of control device 5.

Alignment mechanism 3, as shown in FIG. 1, includes CCD camera 3A described above, and an alignment bridge 3B supporting CCD camera 3A. CCD camera 3A is located between probe card 2 and arrangement unit 1 by entering to a probe center from the backside of a prober chamber via alignment bridge 3B. Herein, during the X-Y direction movement of arrangement unit 1, CCD camera 3A captures an image of semiconductor wafer W from the upper view with a predetermined magnification, transmits the captured image signal to control device 5, and displays the captured image of the semiconductor wafer on display device 4 through control device 5.

Control device 5 includes a central processing unit 5A, a program storage unit 5B to store various programs, such as a program for executing the needle mark determining method according to the present disclosure, a memory unit 5C to store various data, an image processing unit 5D to image-process the captured image signal from CCD camera 3A, an image storage unit 5E to store the image signal from image processing unit 5D as image data, and a display control unit 5F to display the captured image on display device 4 based on the image signal. Also, control device 5 controls the components, including arrangement unit 1, and the like, by transmitting/receiving signals among central processing unit 5A, program storage unit 5B, and memory unit 5C.

Central processing unit 5A, to which an input unit 6 is connected, performs data-processing on various kinds of data signals input from input unit 6, and stores the processed data in memory unit 5C. Also, central processing unit 5A includes a needle mark determining program of the present disclosure stored therein, and performs a determination on a needle mark by operating the program. The determination is based on the basic data required for the needle mark determination, which is input from input unit 6, and on the image of semiconductor wafer W, which is captured by CCD camera 3A. When central processing unit 5A performs the determination on the needle mark, the result of the determination is displayed as a wafer map on display device 4.

The program used for the needle mark determining method of the present disclosure is stored in program storage unit 5B, together with other various programs. Also, these programs can be installed via various recording media, or downloaded via communication media. In the present exemplary embodiment, the needle mark determining method according to the present disclosure is executed by operating the needle mark determining program of the present disclosure, which is stored in program storage unit 5B.

Hereinafter, a needle mark determining method according to one exemplary embodiment of the present disclosure will be described with reference to FIGS. 2 to 8. The needle mark determining method according to the present exemplary embodiment is executed as a part of a testing process of a needle mark.

The test on the electrical properties of semiconductor wafer W is performed by the method as described below. That is, when semiconductor wafer W is arranged on arrangement unit 1, arrangement unit 1 moves to a position below probe card 2 under the control of control device 5. Then, alignment mechanism 3 is operated, and CCD camera 3A enters to a position between arrangement unit 1 and probe card 2 via alignment bridge 3B, and aligns the plurality of electrode pads of each device formed on semiconductor wafer W, with the plurality of probes 2A by cooperating with CCD camera 3A embedded in arrangement unit 1. Next, arrangement unit 1 moves to a test start position, index-transfers semiconductor wafer W, and performs the test on the electrical properties of each device by electrically contacting the plurality of probes 2A with the plurality of electrode pads of semiconductor wafer W located thereon.

After the test is completed, CCD camera 3A of alignment mechanism 3 operates under the control of control device 5, thereby capturing an image of semiconductor wafer W. Then, image processing unit 5D performs image-processing upon the captured image and stores it in image storage unit 5E. The captured image in image storage unit 5E may be displayed on display device 4 via display control unit 5F, as required.

Accordingly, the needle mark determining program of the present disclosure executes the needle mark determining method of the present disclosure based on the captured image by operating via control device 5.

Figure 2A:
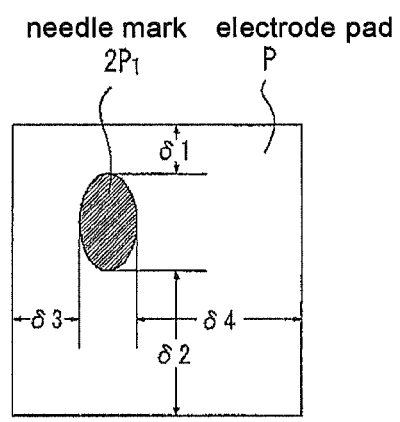
FIGS. 2A and 2B are plan views illustrating examples of a probe needle mark formed on an electrode pad of a device, which is generated by the testing apparatus shown in FIG. 1.
Figure 2B:
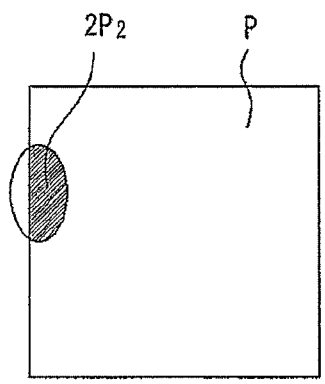

A needle mark on an electrode pad by probes 2A is formed when probe 2A and the electrode pad come on contact with each other with a certain needle pressure, thereby shaving the surface of the electrode pad. When probe 2A comes in contact with an appropriate position of an electrode pad P with a certain needle pressure, a certain size of a needle mark $2P_1$ is formed within the outline of the surface of electrode pad P, as shown in FIG. 2A. However, according to the state of probe 2A, as shown in FIG. 2B, probe 2A may miss the contact position with electrode pad P, thereby coming in contact with an edge of electrode pad P. Thus a partly lacking needle mark $2P_2$ indicated as a white portion shown in FIG. 2B may be formed, thereby causing test failure.

Figure 3A:
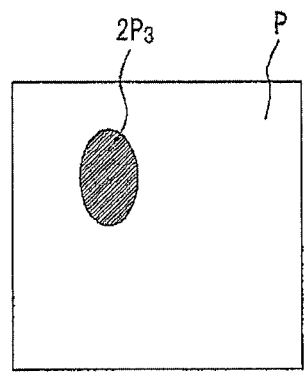
FIGS. 3A and 3B are plan views illustrating another examples of a probe needle mark formed on an electrode pad of a device, which is generated by the testing apparatus shown in FIG. 1.
Figure 3B:
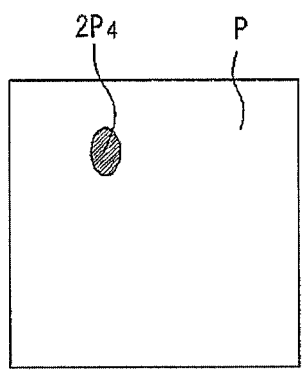

Also, when probe 2A comes in contact with an appropriate position on the surface of electrode pad P with a certain needle pressure, a needle mark $2P_3$ is formed as shown in FIG. 3A. However, in a case where probe 2A is deformed due to its settling and a needle tip of probe 2A retreats to a probe card main body, compared to those of other probes 2A, even though probe 2A comes in contact with an appropriate position of electrode pad P, it cannot contact with electrode pad P with an original needle pressure. This may form a small needle mark $2P_4$, as shown in FIG. 3B, thereby causing test failure.

Figure 4A:
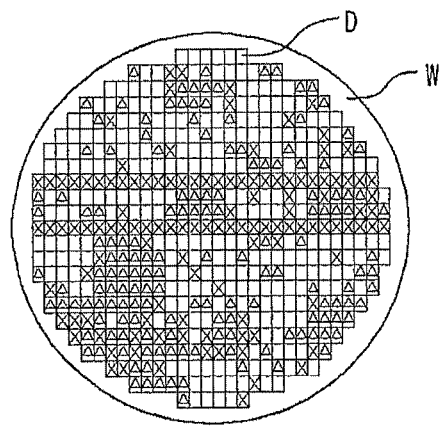
Figure 4B:
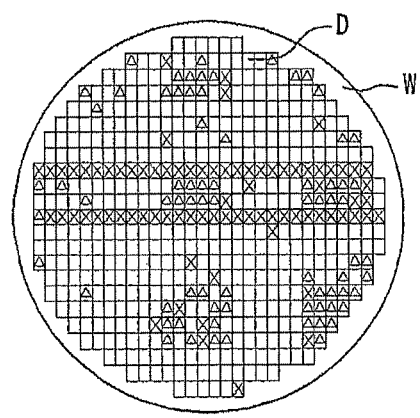
Figure 4C:
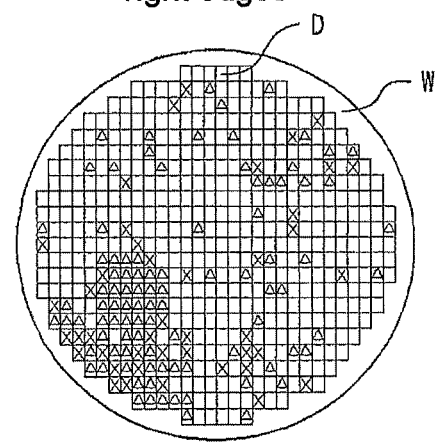

As described above, since various shapes of marks are mixedly formed on each of the plurality of electrode pads, a probe needle mark is sometimes misrecognized in a conventional needle mark test. FIGS. 4A to 4C are wafer maps showing schematic diagrams of images of semiconductor wafer W including electrode pads with various shapes of marks. FIG. 4A is a view showing marks which are distributed at both left and right edges of electrode pads, FIG. 4B is a view showing marks which are distributed in the neighborhood of left edges of electrode pads, and FIG. 4C is a view showing marks which are distributed at right edges of electrode pads. In these figures, a device D with no sign indicates a device including an electrode pad having a satisfactory mark as a needle mark of probe 2A, a □-signed device D indicates a device including an electrode pad having an indefinite mark as a needle mark of probe 2A, and an x-signed device D indicates a device including an electrode pad having a bad mark as a needle mark of probe 2A. By using the needle mark determining method according to the present disclosure, it can be highly precisely determined if marks formed on electrode pads included in each of the plurality of devices are appropriate as probe needle marks in a short time.

Hereinafter, a needle mark determining method according to the present exemplary embodiment, which employs a needle mark determining program of the present disclosure, will be described. In the needle mark determining method according to the present exemplary embodiment, a captured image of semiconductor wafer W is used to observe electrode pad P with an indefinite mark as a probe needle mark formed thereon, and to determine if the mark is appropriate as the probe needle mark.

Figure 5:
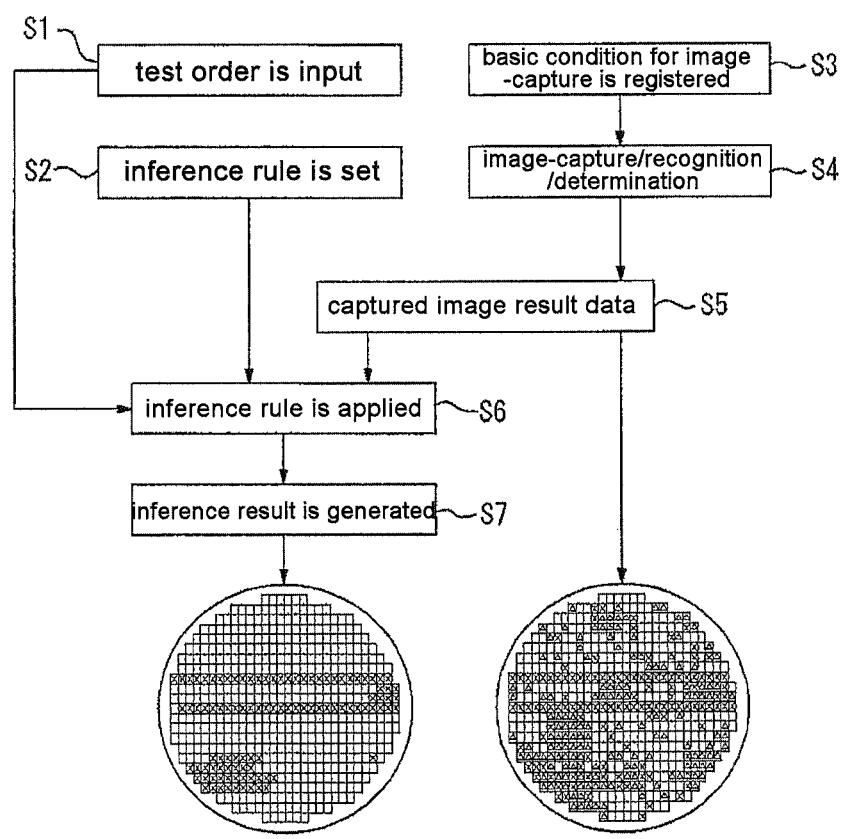
FIG. 5 is a block diagram illustrating a needle mark determining method according to one exemplary embodiment.

That is, in order to execute the needle mark determining program of the present disclosure, as shown in FIG. 5, the test order of respective devices on semiconductor wafer W is input to control device 5 from input unit 6 (step S1), and an inference rule (a needle mark determining program) to determine the quality of a needle mark is set (step S2). This inference rule will be described later. Meanwhile, basic conditions to capture an image of semiconductor wafer W are registered to control device 5 from input unit 6 (step S3), semiconductor wafer W is image-captured by operating CCD camera 3A under the control of control device 5, and it is determined if marks formed on respective electrode pads are appropriate as needle marks of probes 2A, one by one, based on the respective images of the plurality of electrode pads of each device (step S4), and the data showing the captured image result is obtained (step S5).

This imaged result data is obtained as a wafer map shown at the right side in FIG. 5. According to the result data, there are a lot of □ and x signs, in which a □ sign indicates an indefinite mark as a probe needle mark, and an x sign indicates an inappropriate mark as a probe needle mark.

To this captured image result data, the inference rule set in step S2 is applied, thereby determining if the marks formed on each of the plurality of electrode pads of each device are good or bad as probe needle marks (in step S6). Then, the result of the inference (that is, the determination result of the marks as probe needle marks) is obtained (in step S7). The result is shown in the wafer map at the left side in FIG. 5. As clearly shown in this FIG. 5, the needle mark determining method according to the present exemplary embodiment determines if indefinite marks are good or bad as probe needle marks, and thus the result does not include the indefinite marks as the probe needle marks. Moreover, as clearly understood through the comparison of the left side wafer map to the right side wafer map, the wafer map to which the needle mark determining method according to the present exemplary embodiment is applied shows a significantly reduced number of probe needle marks determined to be poor quality. This result was determined to be nearly right through the post verification.

Hereinafter, the inference rule which is a main element in the needle mark determining method according to the present exemplary embodiment will be described with reference to the flow chart shown in FIG. 6. When the inference is initiated through the execution of the needle mark determining program in order to use the inference rule, the multiple devices of the determination captured image are tracked down in order from the initiation of the test to the end of the test, and then scores are given to the marks formed on each of the plurality of electrode pads of each device.

In the present embodiment, as shown in FIG. 2A, scores are differently given based on distances from the edges of mark $2P_1$ to left/right/top/bottom edges of electrode pad P. Herein, the distances from the top/bottom edges of electrode pad P to the edges of mark $2P_1$ are $\delta1$ and $\delta2$, and the distances from the left/right edges of electrode pad P to the edges of mark $2P_1$ are $\delta3$ and $\delta4$. When the distances from edges of electrode pad P to edges of a mark are equal to or greater than, for example, 5 μm, a score of 2 is given, and the mark is defined as a good mark (o) which can be employed as a probe needle mark. When the distances from edges of electrode pad P to edges of a mark are equal to or greater than 0 μm and equal to or lower than 3 m, for example, 1 μm, a score of 1 is given, and the mark is defined as an indefinite mark (□) whose quality is indefinite as a probe needle mark. Also, when the distances are 0 μm, or when a mark overlaps the edge of electrode pad P as shown in FIG. 2B, a score of 0 is given, and the mark is defined as a bad mark (x) which cannot be employed as a probe needle mark.

In determining all of needle marks on semiconductor wafer W, it is determined if marks formed on a plurality of electrode pads of a first device are good or bad, one by one, based on the scores given to the respective marks (step S11). When the respective marks formed on the plurality of electrode pads have scores of 2, in other words, all of the marks are good as probe needle marks ("o" in FIG. 6), the device is determined to be good (in step S12). Then, the same determination is performed on devices following the device. When marks formed on a plurality of electrode pads of the respective devices are good, the respective devices are determined to be good through the repetition of steps S11 and S12.

Figure 7A:
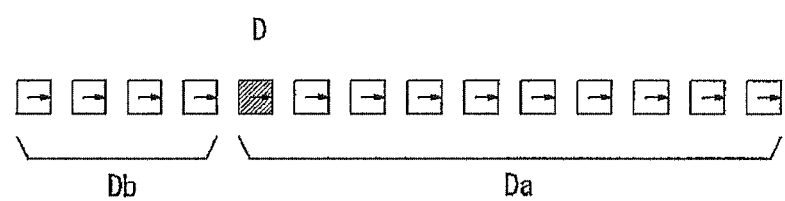
FIGS. 7A to 7C are schematic views illustrating the quality distribution of probe needle marks, obtained by a needle mark determining method according to one exemplary embodiment, in which FIGS. 7A, 7B, and 7C correspond to FIGS. 4A, 4B, and 4C, respectively.

In step S11, when a device (hereinafter, referred to as an object device) including an electrode pad (hereinafter, referred to as an object electrode pad) having an indefinite mark with a score of 1 is detected, the mark formed on the object electrode pad is determined to be not good (o). After such determination, a plurality of successive devices, preceding and following the object device along a test direction, are selected as comparison devices, and it is determined if the indefinite mark of the object electrode pad is good or bad as a probe needle mark with reference to the change of marks on these comparison devices, with the lapse of time. In the present embodiment, as shown in FIG. 7A, four (4) successive comparison devices Db preceding an object device D, and nine (9) successive comparison devices Da following object device D are selected, respectively. From among a plurality of electrode pads of these comparison devices, a score of a mark formed on an electrode pad (hereinafter, referred to as a comparison electrode pad) corresponding to the object electrode pad of the object device is compared with that of the object electrode pad. The object electrode pad and the comparison electrode pad have needle marks formed by the same probe 2A.

That is, when object device D including an object electrode pad having an indefinite mark is detected in step S11, it is determined if the mark formed on a comparison electrode pad of each of 4 successive comparison devices Db preceding object device D is good or bad based on the scores (in step S13). Then, when all of the respective 4 comparison devices Db have electrode pads including O-scored marks that are determined to be bad as probe needle marks, a 1-scored indefinite mark of the object electrode pad is determined to be bad (x), thereby determining that object device D is bad (in step S14).

In step S13, when any one of 4 comparison devices Db preceding object device D is not bad, and includes an electrode pad with an indefinite mark formed thereon, the indefinite mark of object device D is considered to be still indefinite. Then, the scores given to a total of 10 devices including object device D and 9 successive comparison devices Da following object device D are added. The added value is determined if it is equal to or greater than 11 (step S15). If the added value is equal to or greater than 11, the mark formed on the object electrode pad is determined to be good (o) as a probe needle mark (step S16). If the added value is less than 11, the mark formed on the object electrode pad is bad (x) as a probe needle mark (step S14). When the added value including the score of the mark of the object electrode pad together with the scores of the comparison electrode pads, is equal to or less than 10, the pattern of the object electrode pad (which is determined as an indefinite mark) is shown in Table 1.

TABLE 1

| 1 | 2 | 3 | 4 | 5 | 6 | 7 | 8 | 9 | 10 |
|---|---|---|---|---|---|---|---|---|---|
| Δ | x | x | x | x | x | — | — | — | — |
| Δ | x | x | x | x | Δ | — | — | — | — |
| Δ | x | x | x | Δ | Δ | Δ | — | — | — |
| Δ | x |   | Δ | Δ | Δ | Δ | Δ | — | — |
| Δ | x | Δ | Δ | Δ | Δ | Δ | Δ | Δ | — |
| Δ | Δ | Δ | Δ | Δ | Δ | Δ | Δ | Δ | Δ |
| x | x | x | x | x | — | — | — | — | — |
| x | x | x | x | Δ | Δ | — | — | — | — |
| x | x | x | Δ | Δ | Δ | Δ | — | — | — |
| x | x | Δ | Δ | Δ | Δ | Δ | Δ | — | — |
| x | Δ | Δ | Δ | Δ | Δ | Δ | Δ | Δ | — |

Quality determination on marks on electrode pads P of respective devices of semiconductor wafer W is carried out, one by one, through the repetition of steps S11 to S16, thereby determining the quality of needle marks on all of the devices.

This determination result is shown as the semiconductor wafer map at the left side in FIG. 5. As clearly understood through the comparison of the left-side wafer map to the right-side wafer map, when the needle mark determining method according to the present exemplary embodiment is executed, the result includes no indefinite mark. Moreover, it can be clearly determined if a mark is good or bad, and also it can be seen that the number of devices including bad marks (x) is significantly reduced, compared to the right-side wafer map. In other words, in the conventional needle mark determining method, there are a lot of indefinite marks, in other words, quality determinations on many marks as probe needle marks are unclear, whereas in the needle mark determining method according to the present exemplary embodiment, there is no indefinite mark, thereby clearly determining the quality of marks as probe needle marks.

Figure 8A:
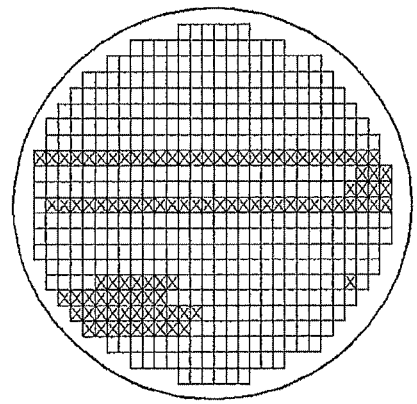
FIGS. 8A to 8C are schematic views illustrating the quality distribution of probe needle marks, obtained by a needle mark determining method according to another exemplary embodiment, in which FIGS. 8A, 8B, and 8C correspond to FIGS. 4A, 4B, and 4C, respectively.
Figure 8B:
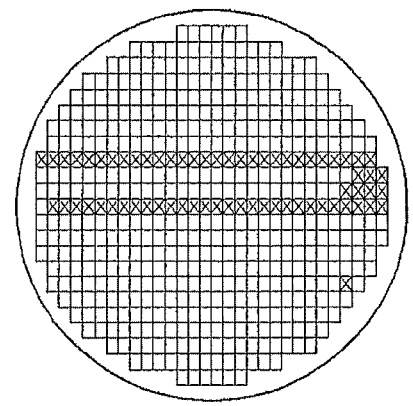
Figure 8C:
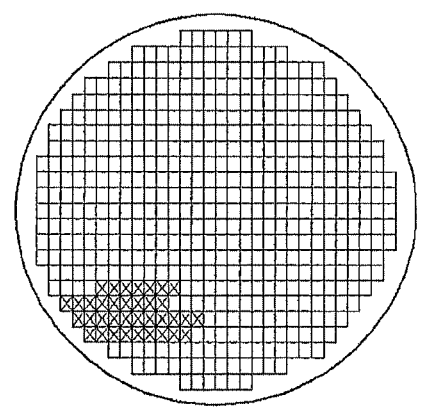

FIGS. 8A to 8C are wafer maps showing the determination results according to the needle mark determining method according to the present exemplary embodiment. FIG. 8B shows a quality determination result based on the distances from left edges of electrode pads P to edges of marks, and FIG. 8C shows a quality determination result based on the distances from right edges of electrode pads P to edges of marks. FIG. 8A shows a quality determination result in which the wafer map in FIG. 8B is added to the wafer map in FIG. 8C. FIG. 8A is the same as the wafer map at the left side in FIG. 5.

Figure 6:
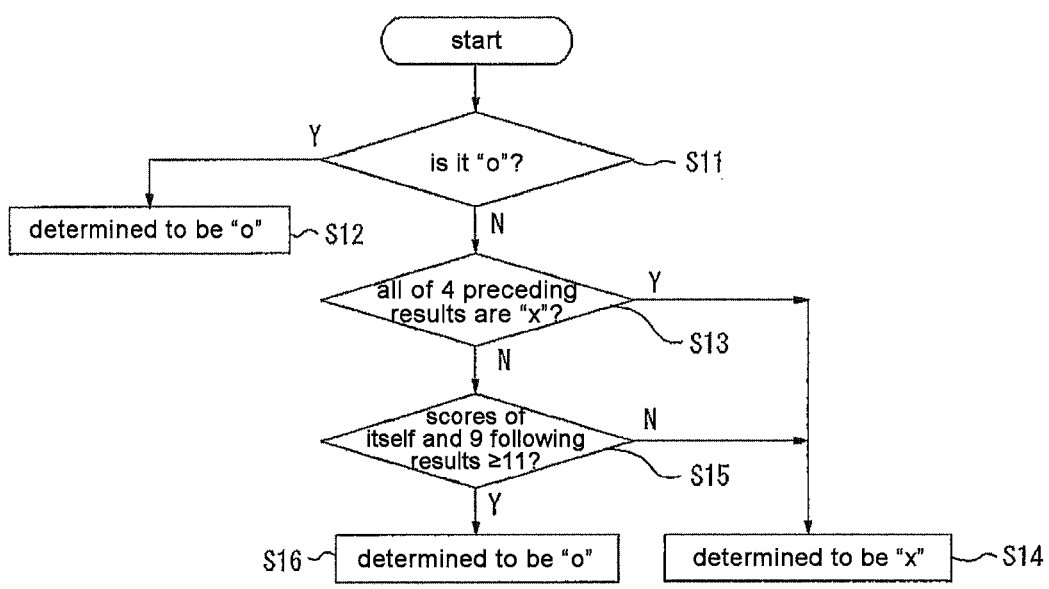
FIG. 6 is a block diagram illustrating a main process of a needle mark determining method according to one exemplary embodiment.
Figure 7B:
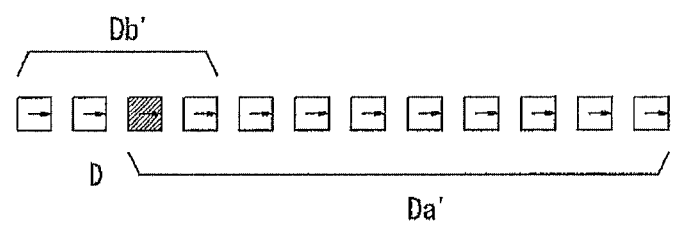

Also, in a case where object device D including object electrode pad P with an indefinite mark formed thereon is detected at the early stage of semiconductor wafer W, (for example, there are only two successive comparison devices Db preceding object device D, instead of 4 successive comparison devices Db), two comparison devices Db preceding object device D, object device D, and one comparison device Da following object device D, as shown in FIG. 7B, are selected to perform the determination on the needle marks according to the flow chart shown in FIG. 6.

Figure 7C:
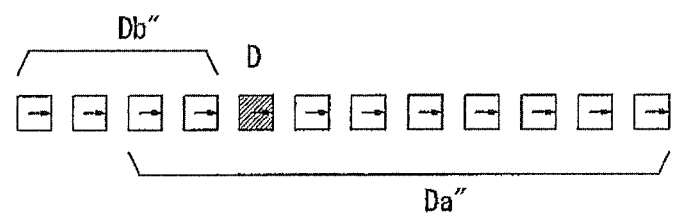

Also, in a case where object device D including object electrode pad P with an indefinite mark formed thereon is detected at the last stage of semiconductor wafer W, (for example, there are only seven successive comparison devices Da following object device D, instead of 9 successive comparison devices Da), two comparison devices Db preceding object device D, object device D, and seven comparison device Da following object device D, as shown in FIG. 7C, are selected to perform the determination on the needle marks according to the flow chart shown in FIG. 6.

As described above, the method according to the present exemplary embodiment includes a first step of giving scores to the respective marks formed on a plurality of electrode pads P of each of a plurality of devices D, in which the scores are used to determine the quality of the marks as probe needle marks, and selecting, based on the scores, object device D including object electrode pad P with an indefinite mark as a probe needle mark formed thereon, and a second step of selecting time-successive 4 comparison devices Db preceding object device D and time-successive 9 comparison devices Da following object device D along the test direction, adding scores given to marks 2P formed on comparison electrode pads P of each of the comparison devices Db and Da corresponding to object electrode pad 2P to the score given to indefinite mark 2P of object device D, and determining if indefinite mark 2P of object device D is good or bad as a probe needle mark through the comparison of the added value with a predetermined reference value. Thus, there is no devices including the indefinite marks as probe needle marks and it can be clearly determined if the marks of all devices D are good or bad as probe needle marks. This may significantly reduce misdetermination on probe needle marks.

Also, although in the above described embodiment, the quality determination on a mark of an object electrode pad of an object device as a probe needle mark is performed with reference to 4 successive comparison devices preceding the object device and 9 successive comparison devices following the object device, the number of comparison devices preceding/following the object device may be appropriately changed as required. Also, although in the above described embodiment, the score is given based on the position of a mark formed on an electrode pad, the score may be given by a needle mark's size difference according to the difference of the extent of a needle pressure. Also, although in the above described embodiment, a higher score indicates a good quality, a reverse analysis of this is possible. Although in the above described embodiment, the determination on needle marks is performed off-line after the completion of a test of semiconductor wafer W, the determination on the needle marks may be performed on-line during the test of semiconductor wafer W. In other words, any method may be within the scope of the present disclosure as long as the method includes the quality determination on a mark of an object electrode pad of an object device as a probe needle mark is performed with reference to marks formed on comparison electrode pads of a plurality of successive comparison devices preceding/following the object device.

The present disclosure may be appropriately used for test apparatuses to test a to-be-tested object, such as a semiconductor wafer.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A method to determine a quality of a needle mark including, when an electrical property test is performed on a plurality of devices formed on a semiconductor wafer by electrically contacting a plurality of electrode pads of each of the plurality of devices with a plurality of probes, obtaining a captured image of the semiconductor wafer by an image capturing means, and determining if respective marks formed on the plurality of electrode pads of the devices are good or bad as probe needle marks based on the captured image, the method comprising:

selecting an object device including an object electrode pad with an indefinite mark as a probe needle mark formed thereon, and selecting a certain number of comparison devices preceding the object device at successive times and another certain number of comparison devices following the object device at successive times along a test direction, and determining if the indefinite mark of the object electrode pad is good or bad as the probe needle mark based on a change in marks over time among the indefinite mark of the object electrode pad and marks formed on respective comparison electrode pads of the plurality of comparison devices preceding and following the object device, the respective comparison electrode pads corresponding to the object electrode pad.

2. The method as claimed in claim 1, wherein when the number of the successive comparison devices preceding the object device does not satisfy said certain number, the number of the object device plus a plurality of successive comparison devices following the object device are added to said number of the successive comparison devices preceding the object device to satisfy said certain number.

3. The method as claimed in claim 1, wherein when the number of the successive comparison devices following the object device does not satisfy said another certain number, the number of the object device plus a plurality of successive comparison devices preceding the object device are added to said number of the successive comparison devices following the object device to satisfy said another certain number.

4. The method as claimed in claim 1, wherein when all of the marks formed on the respective comparison electrode pads of said plurality of successive comparison devices preceding the object device are determined to be bad or good, the indefinite mark of the object device is determined to be bad or good as the probe needle mark without determining quality of the marks formed on the comparison electrode pads of said plurality of successive comparison devices following the object device.

5. The method as claimed in claim 3, wherein the scores are given based on positions or areas of the marks on the electrode pads.

6. The method as claimed in claim 5, wherein when the scores are given based on the positions of the marks, the positions of the marks are determined based on distances from edges of the marks to edges of the electrode pads.

7. The method as claimed in claim 5, wherein when the scores are given based on the positions of the marks on the electrode pads, the indefinite mark indicates a mark formed in the neighborhood of edges of the object electrode pad.

8. A program to determine a needle mark formed in each of a plurality of electrode pads of a plurality of devices formed in a semiconductor wafer, the program being stored in a non-transitory computer readable media, and the program being executed on a computer when an electrical property test is performed on the plurality of devices by electrically contacting the plurality of electrode pads with a plurality of probes, wherein the program, when executed on the computer, performs the method as claimed in claim 1.

* * * * *